United States Patent [19]

Osawa et al.

[11] Patent Number: 5,880,169
[45] Date of Patent: Mar. 9, 1999

[54] SULFONIUM SALTS AND CHEMICALLY AMPLIFIED POSITIVE RESIST COMPOSITIONS

[75] Inventors: Yoichi Osawa; Satoshi Watanabe; Katsuya Takemura; Shigehiro Nagura, all of Nakakubiki-gun; Akinobu Tanaka, Fujisawa; Yoshio Kawai, Isehara, all of Japan

[73] Assignees: Shin-Etsu Chemical Co., Ltd.; Nippon Telegraph and Telephone Corp., both of Tokyo, Japan

[21] Appl. No.: 742,324

[22] Filed: Nov. 1, 1996

[30]   Foreign Application Priority Data

Nov. 2, 1995   [JP]   Japan ................................. 7-309847

[51] Int. Cl.$^6$ ............................ G03F 7/039; G03F 7/038; G03F 7/004
[52] U.S. Cl. ............................... 522/25; 522/31; 522/15; 522/160; 430/270.1
[58] Field of Search ................. 522/31, 25, 15, 522/160; 430/270.1

[56]   References Cited

U.S. PATENT DOCUMENTS

| | | | |
|---|---|---|---|
| 4,451,409 | 5/1984 | Buske et al. | 260/513 R |
| 4,491,628 | 1/1985 | Ito et al. | 430/176 |
| 5,310,619 | 5/1994 | Crivello et al. | 430/270 |
| 5,328,973 | 7/1994 | Roeschert et al. | 526/262 |
| 5,525,453 | 6/1996 | Przybilla et al. | 430/170 |
| 5,550,004 | 8/1996 | Honda | 430/270 |
| 5,558,976 | 9/1996 | Urano et al. | 430/326 |
| 5,569,784 | 10/1996 | Watanabe et al. | 522/31 |
| 5,585,220 | 12/1996 | Breyta et al. | 522/68 |
| 5,612,170 | 3/1997 | Takemura et al. | 430/270.1 |
| 5,654,121 | 8/1997 | Eichhorn et al. | 522/31 |

*Primary Examiner*—Susan W. Berman
*Attorney, Agent, or Firm*—Millen, White, Zelano & Branigan, P.C.

[57]   ABSTRACT

The invention provides a novel sulfonium salt having at least one acid labile group attached to a phenyl group in a molecule and a normal, branched or cyclic $C_1$–$C_{20}$ alkylsulfonate anion. The novel sulfonium salt is effective for increasing the dissolution contrast between exposed and unexposed areas. Upon exposure, it generates an alkylsulfonic acid which is a weak acid, minimizing the influence of side reaction and deactivation during PEB step. The sulfonium salt is useful in a chemically amplified positive resist composition which lends itself to fine patterning and features high resolution.

16 Claims, No Drawings

SULFONIUM SALTS AND CHEMICALLY AMPLIFIED POSITIVE RESIST COMPOSITIONS

BACKGROUND OF THE INVENTION

1. Field of the Invention

This invention relates to a novel sulfonium salt and a chemically amplified positive resist composition containing the same and suitable for use in fine patterning.

2. Prior Art

As the LSI (large scale integration) technology tends toward higher integration and higher speed, further refinement of pattern rules is required. Deep-ultraviolet lithography is regarded promising as the next generation of fine patterning technology. The deep-UV lithography is capable of working on the order of 0.3 to 0.4 µm. If a less light absorbing resist is used, it is possible to form a pattern having a side wall nearly perpendicular to the substrate. Great attention is now paid to the technique of utilizing a high illuminance KrF excimer laser as a deep-UV light source. In order to employ this technique on a mass production scale, a resist material having low light absorption and high sensitivity is desired.

From this point of view, a number of chemically amplified positive working resist materials using acid catalysts were recently developed as disclosed in EP 249139, U.S. Pat. Nos. 4,491,628 and 5,310,619. These materials have high sensitivity, resolution and dry etching resistance and are promising as resist materials especially suited for deep-UV lithography.

It is known that the function of chemically amplified positive resist materials is largely affected by photoacid generators used therein. Typical photoacid generators are onium salts as shown below.

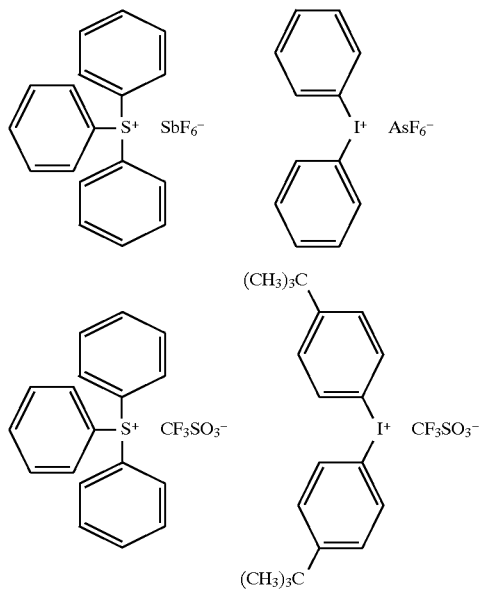

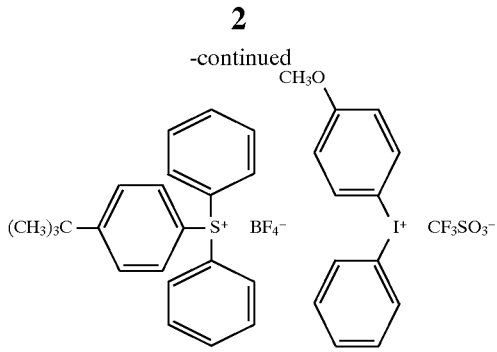

The onium salts themselves are lipophilic. When blended as a resist component, they act to reduce the solubility of the resist material in alkaline aqueous solution and to prevent the resist film from thinning upon development.

However, in exposed areas of positive resist material, photoacid generators absorb actinic radiation to decompose into products which are also lipophilic. The decomposed products reduce the rate of dissolution of the exposed areas in alkaline aqueous solution, failing to provide a high ratio of the alkali dissolution rate of exposed areas to that of unexposed areas (which ratio is known as dissolution contrast).

This problem can be solved by incorporating a tert-butoxycarbonyl group or acid labile group into p-hydroxyphenylsulfonium salts as disclosed in JP-A 26550/1989, 35433/1989, and 12153/1990. Upon exposure to actinic radiation, the salts decompose to generate acids, which help form alkali soluble phenol derivatives, providing an enhanced dissolution contrast.

These tert-butoxycarbonyloxyphenylsulfonium salts, however, lack thermal stability and fail to satisfy the requirement of high resolution. Additionally, they generate strong acids such as metal halide anions and trifluoromethanesulfonic acid. Since the generated acid has high acidity, an acid labile group can be effectively decomposed with a small amount of acid. However, since the amount of acid generated is very small, line patterns would have a T-top profile, that is, patterns become thick at the top if the leave-to-stand or delay time from exposure to post-exposure baking (PEB) is extended. Patterns tend to be readily affected by contamination with air-borne basic substance.

Light exposure generates acid at the resist surface which reacts with air-borne basic substance and is thereby deactivated. As the delay time until PEB is extended, more acid is deactivated and accordingly, decomposition of acid labile groups is more unlikely to occur. As one solution, it is known from JP-A 232706/1993 and 249683/1993 to add a basic compound in a resist material for suppressing the influence of air-borne basic substance. According to our follow-up test, the basic compound used therein is poorly incorporated into the resist film due to volatilization, less compatible with resist components, and unevenly dispersible in a resist film. Thus the basic compound cannot achieve its advantages in a reproducible manner and causes a reduction of resolving power.

It is also reported in Proc. SPIE, 2195, 74–83 (1994) that strong acids such as trifluoromethanesulfonic acid resulting from photolysis reaction give rise to undesirable side reaction during PEB step involving decomposition of a tert-butoxycarbonyloxyphenyl group or acid labile group, forming a by-product having a hydroxyphenyl group tert-butylated at the o-position which causes a reduction of alkali solubility.

SUMMARY OF THE INVENTION

Therefore, an object of the present invention is to provide a novel sulfonium salt suitable for use in a chemically amplified positive resist composition having sufficiently high resolution to comply with a fine patterning technique. Another an object of the present invention is to provide a chemically amplified positive resist composition containing the novel sulfonium salt.

According to the present invention, there is provided a novel sulfonium salt of the following general formula (1):

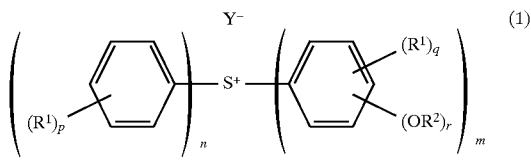

wherein $R^1$ is an alkyl, alkoxy or dialkylamino group, the groups represented by $R^1$ may be the same or different,
$OR^2$ is an acid labile group,
Y is a normal, branched or cyclic alkylsulfonate having 1 to 20 carbon atoms which may contain a carbonyl double bond (C=O), ether bond (C—O—C) or alcoholic hydroxyl group in its structure,
letter n is an integer of 0 to 2, m is an integer of 1 to 3, the sum of n and m is equal to 3, r is an integer of 1 to 5, p is an integer of 0 to 5, q is an integer of 0 to 4, the sum of q and r is an integer of 1 to 5.

Using the sulfonium salt of formula (1) as a resist component, there is obtained a chemically amplified positive resist composition which has sufficiently high resolution to comply with a fine patterning technique and is especially effective with deep-UV lithography.

The following advantages are obtainable where the sulfonium salt of formula (1) is used as one component of a chemically amplified positive resist composition. Although the sulfonium salt itself has low alkali solubility, it is decomposed to generate an acid upon exposure to actinic radiation. This acid, combined with a water content in the resist material and the post-exposure bake (PEB), serves to effectively decompose the acid labile group to form a phenol position having high alkali solubility or a carboxylic acid position having high alkali solubility where the acid labile group is a tertiary carboxylate group such as tert-butoxycarbonylmethyloxy group, providing a higher dissolution contrast. Also, those sulfonium salts wherein an oxygen atom is introduced at the 3-position of a phenyl group to prevent the sulfonium salt from assuming a resonance structure between oxygen and sulfur atoms as found in 4-substituted ones, that is, those sulfonium salts having an acid labile group introduced at the 3-position can suppress light absorption at about 250 nm equally to unsubstituted salts, resulting in a resist material having a high transmittance.

Moreover, the acid generated upon exposure to actinic radiation is not a strong acid like conventional trifluoromethanesulfonic acid, but a relatively weak alkylsulfonic acid. This minimizes the side reactions associated with strong acids and the influence of deactivation of the acid, once generated, by air-borne basic substance at the resist film surface.

Therefore, the sulfonium salt of formula (1) performs well as a photoacid generator for a chemically amplified positive resist composition. Owing to the acid labile group in the sulfonium salt of formula (1), the resist composition will form a resist pattern having a high dissolution contrast, high resolution and a wide range of focal depth.

DETAILED DESCRIPTION OF THE INVENTION

In a first aspect, the present invention provides a novel sulfonium salt having at least one acid labile group attached to a phenyl group in a molecule and a normal, branched or cyclic alkylsulfonate having 1 to 20 carbon atoms. The sulfonium salt is represented by the following general formula (1):

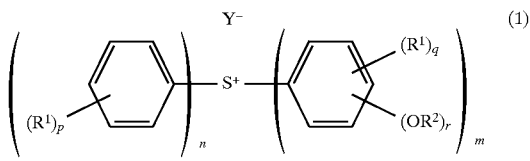

wherein $R^1$ is an alkyl, alkoxy or dialkylamino group, the groups represented by $R^1$ may be the same or different, $OR^2$ is an acid labile group, Y is a normal, branched or cyclic alkylsulfonate having 1 to 20 carbon atoms which may contain a carbonyl double bond (C=O), ether bond (C—O—C) or alcoholic hydroxyl group in its structure, letter n is an integer of 0 to 2, m is an integer of 1 to 3, the sum of n and m is equal to 3, r is an integer of 1 to 5, p is an integer of 0 to 5, q is an integer of 0 to 4, the sum of q and r is an integer of 1 to 5..

Substituents in formula (1) are described in detail. $R^1$ is an alkyl, alkoxy or dialkylamino group. Preferred alkyl groups are those having 1 to 8 carbon atoms such as methyl, ethyl, propyl, isopropyl, n-butyl, sec-butyl, tert-butyl, hexyl, and cyclohexyl groups, with the methyl, ethyl, isopropyl, and tert-butyl groups being especially preferred. Preferred alkoxy groups are those having 1 to 8 carbon atoms such as methoxy, ethoxy, propoxy, isopropoxy, n-butoxy, sec-butoxy, hexyloxy, and cyclohexyloxy groups, with the methoxy, ethoxy, and isopropoxy groups being especially preferred. Preferred dialkylamino groups are those having an alkyl group of 1 to 4 carbon atoms such as dimethylamino, diethylamino and dipropylamino groups, with the dimethylamino group being especially preferred.

$OR^2$ is an acid labile group. Examples of the acid labile group include tertiary alkoxy groups such as tert-butoxy; carbonate groups such as tert-butoxycarbonyloxy; tertiary carboxylate groups such as tert-butoxycarbonylmethyloxy; trialkylsilyloxy groups such as trimethylsilyloxy, triethylsilyloxy, and tert-butyldimethylsilyloxy; and acetal or ketal groups such as tetrahydrofuranyloxy, tetrahydropyranyloxy, 2-methoxytetrahydropyranyloxy, methoxymethyloxy, 1-ethoxyethoxy, 1-propoxyethoxy, 1-n-butoxyethoxy, 1-isobutoxyethoxy, 1-sec-butoxyethoxy, 1-tert-butoxyethoxy, 1-amyloxyethoxy, 1-ethoxy-1-methylethoxy, 1-propoxy-1-methylethoxy, 1-n-butoxy-1-methylethoxy, 1-isobutoxy-1-methylethoxy, 1-sec-butoxy-1-methylethoxy, 1-tert-butoxy-1-methylethoxy, and 1-amyloxy-1-methylethoxy groups.

Y is a normal, branched or cyclic alkylsulfonate having 1 to 20 carbon atoms. It may contain a carbonyl double bond (C=O), ether bond (C—O—C) or alcoholic hydroxyl group in its structure. Examples are normal or branched alkylsulfonates such as methylsulfonate, ethylsulfonate, propylsulfonate, butylsulfonate, isopropylsulfonate, sec-butylsulfonate, isobutylsulfonate, tert-butylsulfonate, hexylsulfonate, and octylsulfonate; cyclic alkylsulfonates such as cyclohexylsulfonate; alkylsulfonates having an alcoholic hydroxyl group and an ether bond (C—O—C) such as 1-hydroxycyclohexylsulfonate and 1-methoxycyclohexylsulfonate; and alkylsulfonates of a bulky skeleton having a carbonyl double bond such as (+)-10-camphorsulfonate.

Where a novel sulfonium salt having an alkylsulfonate, which is a weak acid, as a counter anion (Y⁻) is used as one component of a resist composition, that weak acid anion has the advantage that the influence of deactivation of an acid by air-borne basic substance on the resist film surface is minimized, restraining formation of a sparingly soluble surface layer. The sulfonium salt has satisfactory PED (post-exposure delay) stability, solves the problem of a difficultly soluble surface layer causing a T-top profile, which is known as a PED problem, and provides high sensitivity.

Examples of the sulfonium salt of formula (1) are given below. The sulfonium salts having an acid labile group at the 4-position of a phenyl group are first exemplified. Examples of the sulfonium salt wherein the acid labile group is a tert-butoxy group include (4-tert-butoxyphenyl) diphenylsulfonium ethanesulfonate, (4-tert-butoxyphenyl) diphenylsulfonium butanesulfonate, (4-tert-butoxyphenyl) diphenylsulfonium propanesulfonate, bis(4-tert-butoxyphenyl)phenylsulfonium butanesulfonate, bis(4-tert-butoxyphenyl)phenylsulfonium (+)-10-camphorsulfonate, bis(4-tert-butoxyphenyl)phenylsulfonium butanesulfonate, tris(4-tert-butoxyphenyl)sulfonium butanesulfonate, tris(4-tert-butoxyphenyl)sulfonium (+)-10-camphorsulfonate, tris (4-tert-butoxyphenyl)sulfonium butanesulfonate, (4-tert-butoxyphenyl)bis(4-dimethylaminophenyl)sulfonium methanesulfonate, (4-tert-butoxyphenyl)bis(4-dimethylaminophenyl)sulfonium butanesulfonate, (4-tert-butoxyphenyl)bis(4-dimethylaminophenyl)sulfonium methanesulfonate, bis(4-tert-butoxyphenyl)(4-dimethylaminophenyl)sulfonium methanesulfonate, bis(4-tert-butoxyphenyl)(4-dimethylaminophenyl)sulfonium butanesulfonate, and bis(4-tert-butoxyphenyl)(4-dimethylaminophenyl)sulfonium (+)-10-camphorsulfonate.

Examples of the sulfonium salt wherein the acid labile group is a tert-butoxycarbonyloxy group include bis(4-tert-butoxycarbonyloxyphenyl)phenylsulfonium methanesulfonate, bis(4-tert-butoxycarbonyloxyphenyl) phenylsulfonium butanesulfonate, tris(4-tert-butoxycarbonyloxyphenyl)sulfonium methanesulfonate, tris (4-tert-butoxycarbonyloxyphenyl)sulfonium butanesulfonate, tris(4-tert-butoxycarbonyloxyphenyl) sulfonium (+)-10-camphorsulfonate, (4-tert-butoxycarbonyloxyphenyl)bis(4-dimethylaminophenyl) sulfonium methanesulfonate, (4-tert-butoxycarbonyloxyphenyl)bis(4-dimethylaminophenyl) sulfonium butanesulfonate, bis(4-tert-butoxycarbonyloxyphenyl)(4-dimethylaminophenyl) sulfonium methanesulfonate, bis(4-tert-butoxycarbonyloxyphenyl)(4-dimethylaminophenyl) sulfonium butanesulfonate, and bis(4-tert-butoxycarbonyloxyphenyl)(4-dimethylaminophenyl) sulfonium (+)-10-camphorsulfonate.

Examples of the sulfonium salt wherein the acid labile group is a tert-butoxycarbonylmethyloxy group include bis (4-tert-butoxycarbonylmethyloxyphenyl)phenylsulfonium methanesulfonate, bis(4-tert-butoxycarbonylmethyloxyphenyl)phenylsulfonium butanesulfonate, tris(4-tert-butoxycarbonylmethyloxyphenyl)sulfonium methanesulfonate, tris(4-tert-butoxycarbonylmethyloxyphenyl)sulfonium (+)-10-camphorsulfonate, (4-tert-butoxycarbonylmethyloxyphenyl)bis(4-dimethylaminophenyl)sulfonium methanesulfonate, and bis (4-tert-butoxycarbonylmethyloxyphenyl)(4-dimethylaminophenyl)sulfonium butanesulfonate.

Examples of the sulfonium salt wherein the acid labile group is an acetal or ketal group include those having a tetrahydropyranyl group, such as bis(4-(2-tetrahydropyranyl)oxyphenyl)phenylsulfonium methanesulfonate, tris(4-(2-tetrahydropyranyl)oxyphenyl) sulfonium butanesulfonate, tris(4-(2-tetrahydropyranyl) oxyphenyl)sulfonium (+)-10-camphorsulfonate, (4-(2-tetrahydropyranyl)oxyphenyl)bis(4-dimethylaminophenyl) sulfonium methanesulfonate, and bis(4-(2-tetrahydropyranyl)oxyphenyl)(4-dimethylaminophenyl) sulfonium butanesulfonate;

those having a tetrahydrofuranyl group, such as bis(4-(2-tetrahydrofuranyl)oxyphenyl)phenylsulfonium methanesulfonate, tris(4-(2-tetrahydrofuranyl)oxyphenyl) sulfonium butanesulfonate, tris(4-(2-tetrahydrofuranyl) oxyphenyl)sulfonium (+)-10-camphorsulfonate, (4-(2-tetrahydrofuranyl)oxyphenyl)bis(4-dimethylaminophenyl) sulfonium methanesulfonate, and bis(4-(2-tetrahydrofuranyl)oxyphenyl)(4-dimethylaminophenyl) sulfonium butanesulfonate; and those having an ethoxyethyl group, such as bis(4-(1-ethoxyethoxy)phenyl)phenylsulfonium methanesulfonate, tris(4-(1-ethoxyethoxy)phenyl)sulfonium butanesulfonate, tris(4-(1-ethoxyethoxy)phenyl)sulfonium (+)-10-camphorsulfonate, (4-(l1-ethoxyethoxy)phenyl)bis(4-dimethylaminophenyl)sulfonium methanesulfonate, and bis (4-(1-ethoxyethoxy)phenyl)(4-dimethylaminophenyl) sulfonium butanesulfonate.

Examples of the sulfonium salt wherein the acid labile group is a trialkylsilyloxy group include bis(4-trimethylsilyloxyphenyl)phenylsulfonium methanesulfonate, bis(4-triethylsilyloxyphenyl) phenylsulfonium butanesulfonate, tris(4-trimethylsilyloxyphenyl)sulfonium methanesulfonate, tris (4-trimethylsilyloxyphenyl)sulfonium (+)-10-camphorsulfonate, (4-triethylsilyloxyphenyl)bis(4-dimethylaminophenyl)sulfonium methanesulfonate, and bis (4-trimethylsilyloxyphenyl)(4-dimethylaminophenyl) sulfonium butanesulfonate.

Next, the sulfonium salts having an acid labile group at the 3-position are described. Examples of the sulfonium salt wherein the acid labile group is a tert-butoxy group include (3-tert-butoxyphenyl)diphenylsulfonium ethanesulfonate, (3-tert-butoxyphenyl)diphenylsulfonium butanesulfonate, (3-tert-butoxyphenyl)diphenylsulfonium propanesulfonate, bis(3-tert-butoxyphenyl)phenylsulfonium butanesulfonate, bis(3-tert-butoxyphenyl)phenylsulfonium (+)-10-camphorsulfonate, bis(3-tert-butoxyphenyl) phenylsulfonium butanesulfonate, tris(3-tert-butoxyphenyl) sulfonium butanesulfonate, tris(3-tert-butoxyphenyl) sulfonium (+)-10-camphorsulfonate, tris(3-tert-butoxyphenyl)sulfonium butanesulfonate, (3-tert-butoxyphenyl)bis(4-dimethylaminophenyl)sulfonium methanesulfonate, (3-tert-butoxyphenyl)bis(4-dimethylaminophenyl)sulfonium butanesulfonate, (3-tert-butoxyphenyl)bis(4-dimethylaminophenyl)sulfonium methanesulfonate, bis(3-tert-butoxyphenyl)(4-dimethylaminophenyl)sulfonium methanesulfonate, bis(3-tert-butoxyphenyl)(4-dimethylaminophenyl)sulfonium butanesulfonate, and bis(3-tert-butoxyphenyl)(4-dimethylaminophenyl)sulfonium (+)-10-camphorsulfonate.

Examples of the sulfonium salt wherein the acid labile group is a tert-butoxycarbonyloxy group include bis(3-tert-butoxycarbonyloxyphenyl)phenylsulfonium methanesulfonate, bis(3-tert-butoxycarbonyloxyphenyl) phenylsulfonium butanesulfonate, tris(3-tert-butoxycarbonyloxyphenyl)sulfonium methanesulfonate, tris (3-tert-butoxycarbonyloxyphenyl)sulfonium butanesulfonate, tris(3-tert-butoxycarbonyloxyphenyl)sulfonium (+)-10-camphorsulfonate, (3-tert-butoxycarbonyloxyphenyl)bis(4-dimethylaminophenyl)sulfonium methanesulfonate, (3-tert-butoxycarbonyloxyphenyl)bis(4-dimethylaminophenyl)sulfonium butanesulfonate, bis(3-tert-butoxycarbonyloxyphenyl)(4-dimethylaminophenyl)sulfonium methanesulfonate, bis(3-tert-butoxycarbonyloxyphenyl)(4-dimethylaminophenyl)sulfonium butanesulfonate, and bis(3-tert-butoxycarbonyloxyphenyl)(4-dimethylaminophenyl)sulfonium (+)-10-camphorsulfonate.

Examples of the sulfonium salt wherein the acid labile group is a tert-butoxycarbonylmethyloxy group include bis(3-tert-butoxycarbonylmethyloxyphenyl)phenylsulfonium methanesulfonate, bis(3-tert-butoxycarbonylmethyloxyphenyl)phenylsulfonium butanesulfonate, tris(3-tert-butoxycarbonylmethyloxyphenyl)sulfonium methanesulfonate, tris(3-tert-butoxycarbonylmethyloxyphenyl)sulfonium (+)-10-camphorsulfonate, (3-tert-butoxycarbonylmethyloxyphenyl)bis(4-dimethylaminophenyl)sulfonium methanesulfonate, and bis(3-tert-butoxycarbonylmethyloxyphenyl)(4-dimethylaminophenyl)sulfonium butanesulfonate.

Examples of the sulfonium salt wherein the acid labile group is an acetal or ketal group include those having a tetrahydropyranyl group, such as bis(3-(2-tetrahydropyranyl)oxyphenyl)phenylsulfonium methanesulfonate, tris(3-(2-tetrahydropyranyl)oxyphenyl)sulfonium butanesulfonate, tris(3-(2-tetrahydropyranyl)oxyphenyl)sulfonium (+)-10-camphorsulfonate, (3-(2-tetrahydropyranyl)oxyphenyl)bis(4-dimethylaminophenyl)sulfonium methanesulfonate, and bis(3-(2-tetrahydropyranyl)oxyphenyl)(3-dimethylaminophenyl)sulfonium butanesulfonate;

those having a tetrahydrofuranyl group, such as bis(3-(2-tetrahydrofuranyl)oxyphenyl)phenylsulfonium methanesulfonate, tris(3-(2-tetrahydrofuranyl)oxyphenyl)sulfonium butanesulfonate, tris(3-(2-tetrahydrofuranyl)oxyphenyl)sulfonium (+)-10-camphorsulfonate, (3-(2-tetrahydrofuranyl)oxyphenyl)bis(4-dimethylaminophenyl)sulfonium methanesulfonate, and bis(3-(2-tetrahydrofuranyl)oxyphenyl)(4-dimethylaminophenyl)sulfonium butanesulfonate; and those having an ethoxyethyl group, such as bis(3-(1-ethoxyethoxy)phenyl)phenylsulfonium methanesulfonate, tris(3-(1-ethoxyethoxy)phenyl)sulfonium butanesulfonate, tris(3-(1-ethoxyethoxy)phenyl)sulfonium (+)-10-camphorsulfonate, (3-(1-ethoxyethoxy)phenyl)bis(4-dimethylaminophenyl)sulfonium methanesulfonate, and bis(3-(1-ethoxyethoxy)phenyl)(4-dimethylaminophenyl)sulfonium butanesulfonate.

Examples of the sulfonium salt wherein the acid labile group is a trialkylsilyloxy group include bis(3-trimethylsilyloxyphenyl)phenylsulfonium methanesulfonate, bis(3-triethylsilyloxyphenyl)phenylsulfonium butanesulfonate, tris(3-trimethylsilyloxyphenyl)sulfonium methanesulfonate, tris(3-trimethylsilyloxyphenyl)sulfonium (+)-10-camphorsulfonate, (3-triethylsilyloxyphenyl)bis(4-dimethylaminophenyl)sulfonium methanesulfonate, and bis(3-trimethylsilyloxyphenyl)(4-dimethylaminophenyl)sulfonium butanesulfonate.

Although only the sulfonium salts having an acid labile group at the 4 or 3-position of a phenyl group have been illustrated, a sulfonium salt consisting of 3- and 4-substituted ones in a ratio of 2:1 can be synthesized using bis(3-tert-butoxyphenyl) sulfoxide (2d) and 4-tert-butoxyphenyl Grignard reagent (4) as starting reactants as will be described later. Also, a sulfonium salt consisting of 3- and 4-substituted ones in a ratio of 1:2 can be synthesized using bis(4-tert-butoxyphenyl) sulfoxide (2b) and 3-tert-butoxyphenyl Grignard reagent (4) as starting reactants.

The sulfonium salts of formula (1) according to the invention can be synthesized in accordance with the following route. First of all, a 3 or 4-halogenated-tert-butoxybenzene which can be prepared by a well-known method (see J. Holcombe and T. Livinghouse, J. Org. Chem., 111–115, 51 (1986)) is reacted with magnesium in THF in a conventional manner, obtaining a tert-butoxyphenyl Grignard reagent of the general formula (4). Separately, a diaryl sulfoxide of the general formula (2) is reacted with a trialkylsilyl chloride or bromide of the general formula (3) in an organic solvent. The reaction product is reacted with the Grignard reagent of formula (4) to synthesize a sulfonium salt of the general formula (5) having a tert-butoxyphenyl group as an acid labile group and possessing a chloride or bromide ion as an anion. Further, the chloride or bromide ion of the sulfonium salt of formula (5) is reacted with lead carbonate and an alkylsulfonic acid of the general formula (6) in methanol to effect anion exchange whereby the chloride or bromide ion is removed as lead chloride or lead bromide. There is obtained a sulfonium salt of formula (1a) having an alkylsulfonate anion and a tert-butoxyphenyl group. The process for anion exchange may be done in accordance with F. Marshall, J. Am. Chem. Soc., 342–351, 81 (1959).

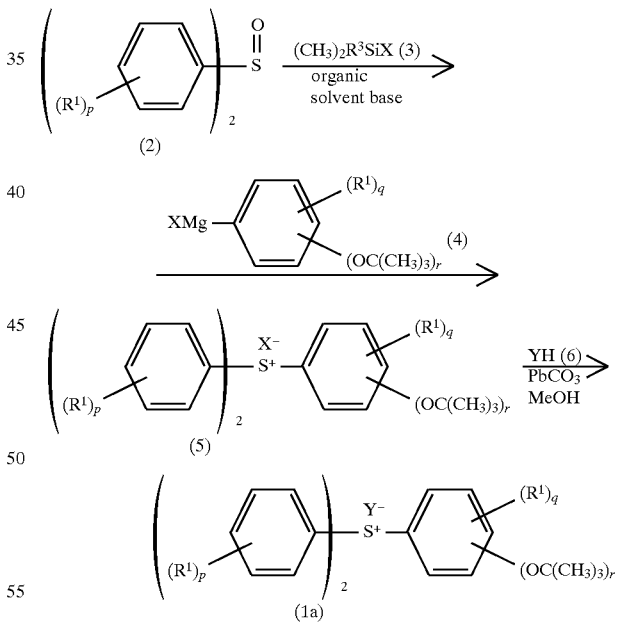

In the formulae, $R^1$, Y, p, q, and r are as defined above, and X is a bromine or chlorine atom.

$R^3$ is a linear or branched alkyl group having 1 to 4 carbon atoms.

The sulfoxide of formula (2) is desirably selected from diphenyl sulfoxide, bis(3,4-di-tert-butoxyphenyl) sulfoxide of formula (2a), bis(4-tert-butoxyphenyl) sulfoxide of formula (2b), bis(4-dimethylaminophenyl) sulfoxide of formula (2c), and bis(3-tert-butoxyphenyl) sulfoxide of formula (2d), all the formulae being shown below. These sulfoxides can be prepared by reacting the corresponding Grignard reagent with thionyl chloride as shown in JPA 7-215930.

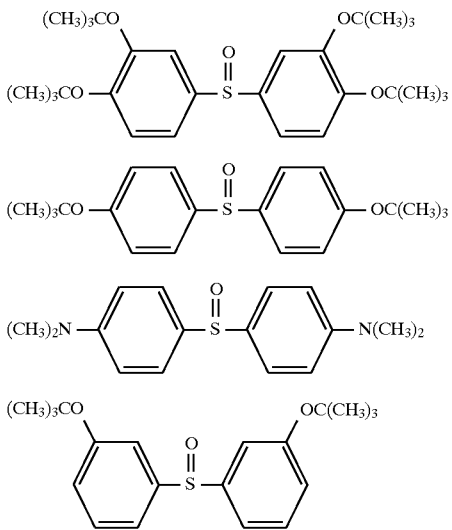

Preferred examples of trialkylsilyl chloride or bromide represented by the above formula (3) include trimethylsilyl chloride, trimethylsilyl bromide, tert-butyldimethylsilyl chloride, tert-butyldimethylsilyl bromide, ethyldimethylsilyl chloride and ethyldimethylsilyl bromide.

According to the invention, novel sulfonium salts having one or three tert-butoxyphenyl groups can be synthesized using the above-mentioned sulfoxides as a starting material. Alternatively, a novel sulfonium salt of formula (1b) having an alkylsulfonate anion and two tert-butoxyphenyl groups can be synthesized by reacting the bis(tert-butoxyphenyl) sulfoxide of formula (2b) or (2d) with an aryl Grignard reagent of the following formula (7), for example, phenyl Grignard reagent and 4-dimethylaminophenyl Grignard reagent to form a sulfonium salt of formula (5a) having two tert-butoxyphenyl groups and possessing a chloride or bromide ion and thereafter, effecting anion exchange as mentioned above.

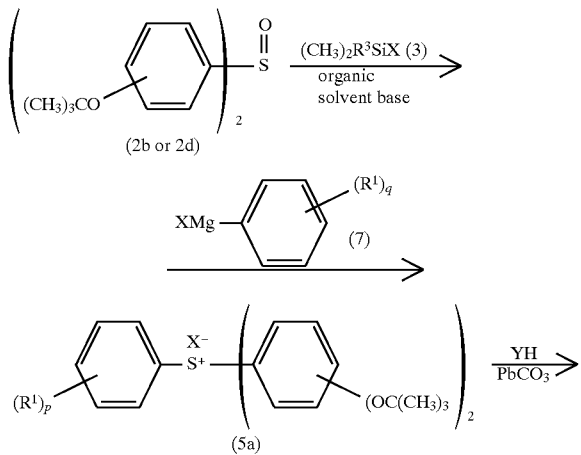

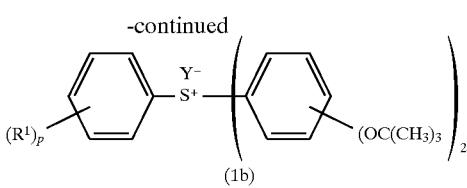

In the formulae, $R^1$, $R^3$, Y, X, p, q, and r are as defined above.

As seen from the above-mentioned reaction schemes, acid labile groups and various functional substituent groups can be introduced by changing the combination of a diphenyl sulfoxide derivative and an aryl Grignard reagent. For example, sulfonium salts having three phenyl groups each having an acid labile group can be synthesized in various combinations embracing a sulfonium salt having all the substituents at the 4-position of phenyl groups, a sulfonium salt having all the substituents at the 3-position, a sulfonium salt having two substituents at the 4-position and one substituent at the 3-position, and a sulfonium salt having one substituent at the 4-position and two substituents at the 3-position.

It is noted that where a sulfoxide having tert-butoxy groups at 2 and 2'-positions like bis(2,4-di-tert-butoxyphenyl) sulfoxide is used as the sulfoxide of formula (2), a sulfonium salt cannot be formed because of steric hindrance. This is also true where a sulfoxide having tetrahydropyranyloxy groups at 2 and 2'-positions is used. It is noted that a sulfonium salt having only one 2-substituted phenyl group can be synthesized when a reagent of formula (7) has a tert-butoxy group at the 2-position.

In a conventional method for synthesizing a sulfonium salt or sulfoxide compound through reaction of phenol or anisole with thionyl chloride, there can be formed either an ortho- or para-substituted compound depending on a particular reagent used since the phenol has two active sites at the ortho and para-positions. Instead, a meta-substituted compound cannot be obtained. In this reaction, synthesis starting with a compound having an acid labile group such as tert-butoxyphenyl is difficult since hydrogen chloride gas is given off in the reaction system. In contrast, the method using a Grignard reagent according to the invention is advantageous in that only a meta-substituted compound is obtained in a quantitative manner and decomposition of an acid labile group does not proceed because only an inorganic salt such as magnesium chloride is formed instead of hydrogen chloride gas.

In the synthesis of conventional sulfonium salts which generate strong acids such as sulfonium trifluoromethanesulfonate according to prior art techniques, sulfoxides, Grignard reagents, and trialkylsilylsulfonates (e.g., trialkylsilyltrifluoromethanesulfonates) are used as in the above-mentioned reaction, so that an anion such as trifluoromethanesulfonate is introduced in a substantially quantitative manner. If the prior art process is applied to the synthesis of a novel sulfonium salt of the invention wherein a trialkylsilylalkylsulfonate obtained by trialkylsilylated alkylsulfonic acid is used instead of trialkylsilyl chloride, there is obtained a mixture of a sulfonium salt having an alkylsulfonate anion and a sulfonium salt having a chloride ion or bromide ion originating from the Grignard reagent as an anion. It is impossible to produce a sulfonium salt having alkylsulfonate in a quantitative manner. In this regard, the above-mentioned reaction process of the present invention is successful in introducing an alkylsulfonate anion into a sulfonium salt in a substantially quantitative manner by isolating sulfonium chloride or bromide, adding lead carbonate and alkylsulfonic acid, and precipitating lead chloride or lead bromide.

Although the above-mentioned synthesis process uses a tert-butoxyphenyl Grignard reagent as a starting reactant for the sulfoxide and the sulfonium salt, it is also possible to synthesize a sulfonium salt of formula (1) by using a Grignard reagent prepared by protecting the hydroxyl group of a halogenated phenol with a protective group inert to the Grignard reagent and decomposable with an acid, for example, tetrahydropyranyl, tetrahydrofuranyl, and ethoxyethyl groups and reacting it with magnesium.

In the above-mentioned synthesis reaction of the sulfonium salts, it is preferred to mix 1 mol of the sulfoxide of formula (2) with 1 to 5 mol, especially 2 to 3 mol of the trialkylsilyl chloride or bromide of formula (3) and to add 1 to 5 mol, especially 2 to 3 mol of the Grignard reagent of formula (4) or (8) per mol of the sulfoxide of formula (2). These reactions are desirably effected in an organic solvent such as THF and methylene chloride in the presence of an organic base such as triethylamine and pyridine for preventing the decomposition of tert-butoxy group due to traces of acidic impurities in the trialkylsilyl halide of formula (3). Reaction conditions are not restrictive although a reaction temperature of 0° to 10° C. is preferred.

In carrying out anion exchange on the sulfonium salt having a chloride or bromide ion obtained under the above-mentioned reaction conditions, it is desirable, though not critical, to add 1.0 to 1.5 mol of the alkylsulfonic acid of formula (6) and 0.5 to 1.5 mol of lead carbonate per mol of the sulfonium salt of formula (5) and effecting reaction in an organic solvent such as methanol at a temperature of 0° to 50° C. for 30 minutes to 2 hours. In this regard, if the proportion of the alkylsulfonic acid of formula (6) or the reaction temperature is too high, there is a possibility that decomposition reaction of a tert-butoxyphenyl group or acid labile group take place.

According to the present invention, a novel sulfonium salt of formula (1) having a desired acid labile group and an alkylsulfonate anion can be obtained by further decomposing the tert-butoxy group of the sulfonium salt of formula (1a) or (1b) with the alkylsulfonic acid of formula (6) and substituting an acid labile group such as tert-butoxycarbonyl, tert-butoxycarbonylmethyl, trialkylsilyl, tetrahydropyranyl, tetrahydrofuranyl, ethoxyethyl, and methoxymethyl groups for the hydrogen atom of a phenolic hydroxyl group in a conventional manner as shown below.

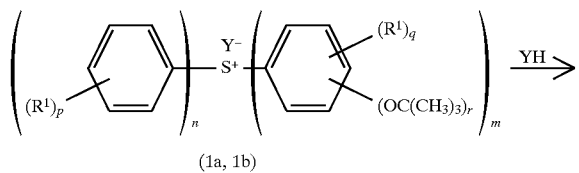

(1a, 1b)

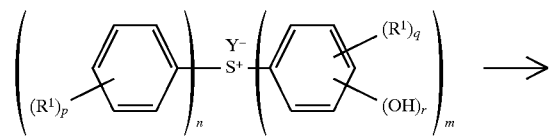

-continued

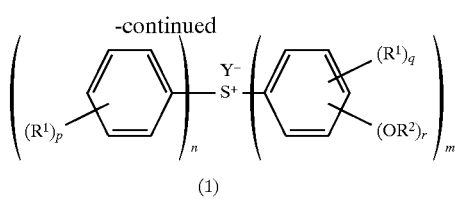

(1)

In the formulae, $R^1$, $R^2$, Y, n, m, p, q, and r are as defined above.

In a second aspect, the present invention provides a chemically amplified, positive working resist composition comprising the sulfonium salt of formula (1). The resist composition may be formulated as either a two component chemically amplified, positive resist composition (alkali soluble resin/photoacid generator/organic solvent) or a three component chemically amplified, positive resist composition (alkali soluble resin/photoacid generator/dissolution rate inhibitor/organic solvent), with the three component system being preferred.

Typical embodiments of the resist composition of the invention are shown below.

Embodiment (i) is a chemically amplified positive resist composition comprising
 (A) an organic solvent,
 (B) an alkali soluble resin,
 (C) a dissolution rate inhibitor having an acid labile group,
 (D) a sulfonium salt of formula (1), and
 (E) a photoacid generator.

Embodiment (ii) is a chemically amplified positive resist composition comprising
 (A) an organic solvent,
 (B) an alkali soluble resin,
 (C) a dissolution rate inhibitor having an acid labile group,
 (D) a sulfonium salt of formula (1), and
 (F) an onium salt of the following general formula (8):

$$(R^4)_a MY' \qquad (8)$$

wherein $R^4$ is independently selected from substituted or unsubstituted aromatic groups, M is sulfonium or iodonium, Y' is a substituted or unsubstituted alkylsulfonate or arylsulfonate, and letter a is equal to 2 or 3.

Embodiment (iii) is a chemically amplified positive resist composition comprising
 (A) an organic solvent,
 (B) an alkali soluble resin,
 (C) a dissolution rate inhibitor having an acid labile group, and
 (D) a sulfonium salt of formula (1).

Embodiment (iv) is a chemically amplified positive resist composition comprising
 (A) an organic solvent,
 (B) an alkali soluble resin, and
 (D) a sulfonium salt of formula (1).

Embodiment (v) is a chemically amplified, positive resist composition comprising
 (A) an organic solvent,
 (B) an alkali soluble resin,
 (D) a sulfonium salt of formula (1), and
 (E) a photoacid generator.

Examples of organic solvent (A) include ketones such as cyclohexanone and methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate and ethyl 3-ethoxypropionate, alone or in admixture of two or more.

Examples of alkali soluble resin (B) as the base resin include polyhydroxystyrene and derivatives thereof. Preferred are those polyhydroxystyrene derivatives wherein hydrogen atoms of some OH groups of polyhydroxystyrene are replaced by acid labile groups and hydroxystyrene copolymers. In the former, examples of the acid labile group used therein include substituents of tert-butyl derivatives such as tert-butyl, tert-butoxycarbonyl, and tert-butoxycarbonylmethyl groups; normal or branched chain acetal groups such as 1-ethoxyethyl, 1-propoxyethyl, 1-n-butoxyethyl, 1-isobutoxyethyl, 1-tert-butoxyethyl, and 1-tert-amyloxyethyl groups; and cyclic acetal groups such as tetrahydrofuranyl, tetrahydropyranyl, and 2-methoxytetrahydropyranyl groups. These acid labile groups may be used alone or in admixture of two or more at the same time. The polyhydroxystyrene derivatives should preferably have a weight average molecular weight of about 3,000 to about 100,000. Film formability and resolution would be poor with Mw of less than 3,000 whereas resolution would be poor with Mw of more than 100,000. Included in the hydroxystyrene copolymers are copolymers of hydroxystyrene and styrene, copolymers of hydroxystyrene and tert-butyl acrylate, copolymers of hydroxystyrene and tert-butyl methacrylate, copolymers of hydroxystyrene and maleic anhydride, and copolymers of hydroxystyrene and di-tert-butyl maleate.

According to the invention, the sulfonium salt of formula (1) is blended as photoacid generator (D). If necessary, a mixture of sulfonium salts of formula (1) having different acid labile groups or different alkyl or aryl sulfonate anions may be used. Also if necessary, another photoacid generator may be blended as component (E) in addition to the sulfonium salt of formula (1). The other photoacid generators which can be used as component (E) include onium salts, oxime sulfonic acid derivatives, 2,6-dinitrobenzylsulfonate derivatives, diazonaphthoquinone sulfonate derivatives, 2,4-bistrichloromethyl-6-aryl-1,3,5-triazine derivatives, aryl sulfonate ester derivatives, pyrogallol sulfonate ester derivatives, N-sulfonyloxyimide derivatives such as N-trifluoromethanesulfonyloxyphthalide and N-trifluoromethanesulfonyloxynaphthalide, α,α'-bisarylsulfonyl diazomethane derivatives, and α,α'-bisalkylsulfonyl diazomethane derivatives. Preferred are onium salts of the following general formula (8):

$$(R^4)_a MY' \tag{8}$$

wherein $R^4$ is independently selected from substituted or unsubstituted aromatic groups, M is sulfonium or iodonium, Y' is a substituted or unsubstituted alkylsulfonate or arylsulfonate, and letter a is equal to 2 or 3. Exemplary aromatic groups represented by $R^4$ are a phenyl group and phenyl groups having an alkyl or alkoxy substituent as described for $R^1$ in formula (1).

Illustrative examples of the onium salt of formula (8) are given by the following iodonium and sulfonium salts.

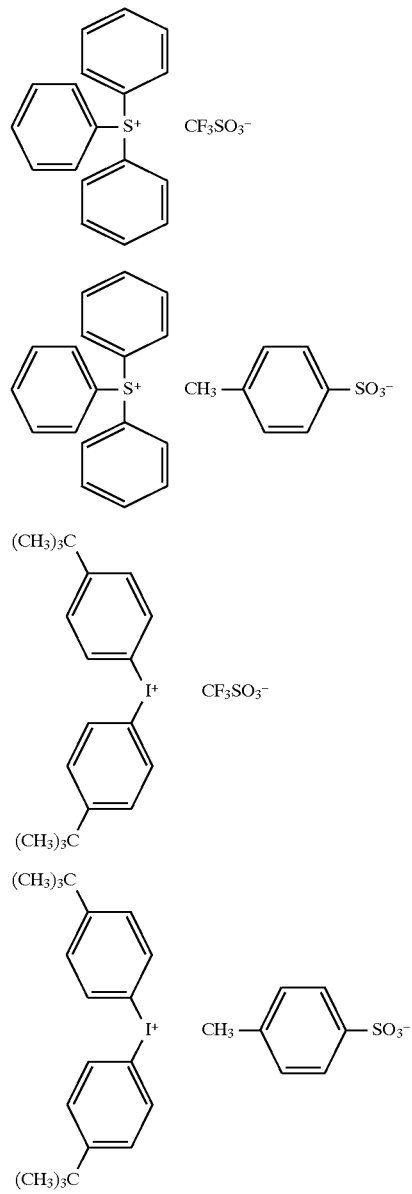

These photoacid generators may be used alone or in admixture of two or more.

Dissolution rate inhibitor (C) should have at least one group which is decomposable with an acid (acid labile group) in a molecule and may be either a low molecular weight compound or a polymer. Any of well-known dissolution rate inhibitors may be used. Exemplary low molecular weight compounds include bisphenol A derivatives and carbonate derivatives. Preferred are those bisphenol A derivatives wherein the hydrogen atom of the hydroxyl group of bisphenol A is replaced by tert-butyl derivative substituents such as tert-butyl, tert-butoxycarbonyl, and tert-butoxycarbonylmethyl groups; normal or branched chain acetal groups such as 1-ethoxyethyl, 1-propoxyethyl, 1-n-butoxyethyl, 1-isobutoxyethyl, 1-tert-butoxyethyl, and 1-tert-amyloxyethyl groups; and cyclic acetal groups such as tetrahydrofuranyl, tetrahydropyranyl, and 2-methoxytetrahydropyranyl groups. Also preferred are tert-butyl 4,4-bis(4-hydroxyphenyl)valerate derivatives wherein the hydrogen atom of the hydroxyl group is replaced by tert-butyl derivative substituents such as tert-butyl, tert-butoxycarbonyl, and tert-butoxycarbonylmethyl groups; normal or branched chain acetal groups such as 1-ethoxyethyl, 1-propoxyethyl, 1-n-butoxyethyl, 1-isobutoxyethyl, 1-tert-butoxyethyl, and 1-tert-amyloxyethyl groups; and cyclic acetal groups such as tetrahydrofuranyl and tetrahydropyranyl groups. These acid labile groups may be contained alone or in admixture of two or more.

Examples of the polymeric dissolution rate inhibitor include copolymers of p-butoxystyrene and t-butyl acrylate, and copolymers of p-butoxystyrene and maleic anhydride, with those copolymers having a weight average molecular weight of about 500 to about 10,000 being preferred.

Preferably the two-component resist composition is comprised of, in parts by weight, (A) about 150 to 700 parts, more preferably 250 to 500 parts of an organic solvent, and (B) about 70 to 90 parts, more preferably 75 to 85 parts of an alkali soluble resin. The three-component resist composition further includes (C) about 5 to 40 parts, more preferably 10 to 25 parts of a dissolution rate inhibitor having an acid labile group.

As component (D), about 0.5 to 15 parts, especially 2 to 8 parts of a sulfonium salt of formula (1) is preferably blended. With less than 0.5 part of the sulfonium salt, the amount of acid generated upon exposure would be too small to ensure sensitivity and resolution. With more than 15 parts of the sulfonium salt, a resist film would have low transmittance and resolution.

The other photoacid generator (E), if blended, is preferably used in amounts of about 0.5 to 15 parts, more preferably 2 to 8 parts.

The resist composition of the invention may further contain various additives, for example, carboxylic acid derivatives and nitrogenous compounds for improving PED stability, surfactants for facilitating coating, and light-absorbing agents for reducing irregular reflection from the substrate.

Exemplary carboxylic acid derivatives include 4-hydroxyphenylacetic acid, 3-hydroxyphenylacetic acid, 2-hydroxyphenylacetic acid, 3-(4-hydroxyphenyl)propionic acid, 3-(2-hydroxyphenyl)propionic acid, 2,5-dihydroxyphenylacetic acid, 3,4-dihydroxyphenylacetic acid, 1,2-phenylenediacetic acid, 1,3-phenylenediacetic acid, 1,4-phenylenediacetic acid, 1,2-phenylenedioxydiacetic acid, 1,4-phenylenedipropanoic acid, benzoic acid, 4,4-bis(4-hydroxyphenyl)valeric acid, 4-tert-butoxyphenylacetic acid, 4-(4-hydroxyphenyl)butyric acid, 3,4-dihydroxymandelic acid, and 4-hydroxymandelic acid. The carboxylic acid derivative is preferably blended in an amount of about 0.1 to 15 parts, especially about 1 to 10 parts in the resist composition of the invention.

Typical nitrogenous compounds are amine and amide compounds having a boiling point of 150° C. or higher. Examples include aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methylpyrrolidone, imidazole, α-picoline, β-picoline, γ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol, and triazines such as 2-(p-chlorophenyl)-4,6-trichloromethyl-s-triazine. Preferred among others are pyrrolidone, N-methylpyrrolidone, o-, m- and p-aminobenzoic acid, 1,2-, 1,3- and 1,4-phenylenediamine.

The nitrogenous compound is preferably blended in an amount of about 0.05 to 4 parts, especially about 0.1 to 1 part in the resist composition of the invention.

Examples of the surfactant include perfluoroalkylpolyoxyethylene ethanols, fluorinated alkyl esters, perfluoroalkylamine oxides, and perfluoroalkyl EO addition products.

Examples of the light-absorbing agent include diaryl sulfoxides, diaryl sulfones, 9,10-dimethylanthracene, and 9-fluorenone.

With respect to the use of the resist composition of the invention and light exposure, any of well-known lithography techniques may be used. The resist composition of the invention is best suited for fine patterning using deep UV light of 254 to 193 nm and electron beams.

There has been described a novel sulfonium salt of formula (1) having an acid labile group introduced therein and serving as a photoacid generator. Due to the inclusion of an acid labile group, it affords an enhanced dissolution contrast between exposed and unexposed areas. Upon exposure, it generates an alkyl sulfonic acid which is weaker than conventionally generated acids such as trifluoromethane sulfonic acid. The weak acid is effective for minimizing side reaction during PEB step after exposure and the influence of deactivation of the generated acid by neutralization with a basic compound incoming from the resist film surface. Consequently, the sulfonium salt of formula (1) is useful as a component of a chemically amplified positive working resist composition adapted for fine patterning technique and having high resolution. Also, those sulfonium salts wherein an oxygen atom is introduced at the 3-position of a phenyl group to prevent the sulfonium salt from assuming a resonance structure between oxygen and sulfur atoms, that is, those sulfonium salts having an acid labile group introduced at the 3-position are effective for suppressing light absorption at about 250 nm equally to unsubstituted salts, resulting in a resist material having a high transmittance. The resist composition containing a novel sulfonium salt of formula (1) is sensitive to actinic radiation such as deep Uv, electron beams and X-rays, especially KrF excimer laser beams as a positive resist material, can be patterned by development with alkaline aqueous solution, and has high sensitivity, resolution and resistance to plasma etching with the resulting resist pattern having improved heat resistance.

EXAMPLE

Examples of the present invention are given below by way of illustration and not by way of limitation. The synthesis of novel sulfonium salts is described prior to Examples and Comparative Examples. All parts are by weight.

Synthesis Example 1

Synthesis of tris(4-tert-butoxyphenyl)sulfonium butanesulfonate

A solution of 17.8 g (0.052 mol) of bis(4-tert-butoxyphenyl) sulfoxide in 52 g of THF was cooled on an ice bath. To the solution, 5.3 g (0.052 mol) of triethylamine was added and 14.1 g (0.13 mol) of trimethylsilyl chloride was dropwised at 0° to 10° C. Stirring was continued at 0° to 10° C. for 30 minutes. To this solution, a Grignard reagent which was conventionally prepared from 24.0 g (0.13 mol) of 4-tert-butoxychlorobenzene, 3.2 g (0.13 mol) of magnesium, and 40 g of THF was dropwised at 0° to 10° C. Stirring was continued at 0° to 10° C. for 30 minutes. 300 g of 20% ammonium chloride aqueous solution was added to the reaction mixture. To the organic layer was added 500 g of chloroform. The organic layer was washed twice with 200 g of water and the solvent was evaporated and residue was purified by column chromatography (silica gel, eluent: chloroform/methanol), isolating 9.3 g (yield 35%) of tris(4-tert-butoxyphenyl)sulfonium chloride with 99% purity.

In 93 g of methanol was dissolved 9.3 g (0.018 mol) of tris(4-tert-butoxyphenyl)sulfonium chloride. 3.5 g (0.013 mol) of lead carbonate and 3.0 g (0.022 mol) of butanesulfonic acid were added to the solution, which was heated at 50 ° C. After cooling, the precipitate was filtered off and the filtrate was evaporated. Then 100 g of chloroform was added to the residue, the solution was washed with 100 g of water, and the solution was evaporated again, obtaining 9.2 g (two-steps yield 29%) of tris(4-tert-butoxyphenyl)sulfonium butanesulfonate with 97% purity.

The thus obtained tris(4-tert-butoxyphenyl)sulfonium butanesulfonate was analyzed by nuclear magnetic resonance (NMR) spectroscopy, infrared (IR) spectroscopy, ultraviolet (UV) spectroscopy, and elemental analysis. The results are shown below.

$^1$H-NMR (CDCl$_3$, δ, ppm):

$$\underset{d}{CH_3}-\underset{e}{CH_2}-\underset{f}{CH_2}-\underset{g}{CH_2}-SO_3^-$$

(CH$_3$)$_3$CO—⟨b,c benzene⟩—S$^+$—⟨benzene⟩—OC(CH$_3$)$_2$
                                  |
                              ⟨benzene⟩
                                  |
                              OC(CH$_3$)$_3$

| | | | |
|---|---|---|---|
| (a, e) | 1.10–1.26 | multiplet | 29H |
| (b) | 7.00–7.04 | doublet | 6H |
| (c) | 7.51–7.55 | doublet | 6H |
| (d) | 0.65–0.71 | triplet | 3H |
| (f) | 1.62–1.74 | multiplet | 2H |
| (g) | 2.59–2.66 | triplet | 2H |

IR: (cm$^{-1}$) 2978, 1583, 1489, 1369, 1305, 1261, 1163, 896

Elemental analysis for C$_{34}$H$_{45}$O$_6$S$_2$ Calcd. (%) C: 66.5 H: 7.4 Found (%) C: 66.4 H: 7.3

Synthesis Example 2

Synthesis of (4-tert-butoxyphenyl)diphenylsulfonium butanesulfonate

A solution of 20.2 g (0.10 mol) of diphenyl sulfoxide in 200 g of methylene chloride was cooled on an ice bath. To the solution, 5.3 g (0.052 mol) of triethylamine was added and 32.6 g (0.30 mol) of trimethylsilyl chloride was dropwised at 0° to 20° C. Stirring was continued at 0° to 10° C. for 15 minutes. To this solution, a Grignard reagent which was conventionally prepared from 55.4 g (0.30 mol) of 4-tert-butoxychlorobenzene, 7.3 g (0.30 mol) of magnesium, and 90 g of THF was dropwised at 0° to 10° C. Stirring was continued at 0° to 10° C. for 30 minutes. 500 g of 20% ammonium chloride aqueous solution was added to the reaction mixture. To the organic layer was added 1,000 g of chloroform. The organic layer was once washed with 200 g of water and evaporated. The residue was purified by recrystalization, isolating 26.6 g (yield 72%) of (4-tert-butoxyphenyl)diphenylsulfonium chloride with 98% purity.

In 36 g of methanol was dissolved 3.3 g (0.009 mol) of (4-tert-butoxyphenyl)diphenylsulfonium chloride. 1.7 g (0.0063 mol) of lead carbonate and 1.4 g (0.010 mol) of butanesulfonic acid were added to the solution, which was heated at 40° C. After cooling, the precipitate was filtered off and the filtrate was evaporated. 100 g of chloroform was added to the residue, the solution was washed with 100 g of water, and the solvent layer was evaporated again, obtaining 3.5 g (two-steps yield 64%) of (4-tert-butoxyphenyl) diphenylsulfonium butanesulfonate with 97% purity.

The thus obtained (4-tert-butoxyphenyl) diphenylsulfonium butanesulfonate was analyzed by NMR, IR, UV spectroscopy, and elemental analysis. The results are shown below.

$^1$H-NMR (CDCl$_3$, δ, ppm):

$$\underset{d}{CH_3}-\underset{e}{CH_2}-\underset{f}{CH_2}-\underset{g}{CH_2}-SO_3^-$$

(CH$_3$)$_3$CO—⟨b,c benzene⟩—S$^+$—⟨c' benzene⟩
                                  |
                              ⟨benzene⟩

| | | | |
|---|---|---|---|
| (a) | 1.27 | singlet | 27H |
| (b) | 7.03–7.06 | doublet | 2H |
| (c + c') | 7.46–7.64 | multiplet | 12H |
| (d) | 0.65–0.71 | triplet | 3H |
| (e) | 1.14–1.22 | multiplet | 2H |
| (f) | 1.62–1.74 | multiplet | 2H |
| (g) | 2.59–2.66 | triplet | 2H |

IR:(cm$^{-1}$) 2964, 1583, 1490, 1486, 1477, 1446, 1265, 1211, 1203, 1176, 1068, 1049, 752, 684, 599

Elemental analysis for C$_{26}$H$_{32}$O$_4$S$_2$ Calcd. (%) C: 66.1 H: 6.82 Found (%) C: 66.3 H: 6.79

Synthesis Example 3

Reaction was carried out as in Synthesis Example 1 except that (+)-10-camphorsulfonic acid was used instead of the butanesulfonic acid, obtaining tris(4-tert-butoxyphenyl)sulfonium (+)-10-camphorsulfonate with 98% purity in a yield of 35%.

The thus obtained tris(4-tert-butoxyphenyl)sulfonium (+)-10-camphorsulfonate was analyzed by NMR, IR, UV spectroscopy, and elemental analysis. The results are shown below.

$^1$H-NMR (CDCl$_3$, δ, ppm):

(camphorsulfonate structure with labels d,e (CH$_3$, CH$_3$), f, g,h, $^-O_3S$—CH$_2$, O)

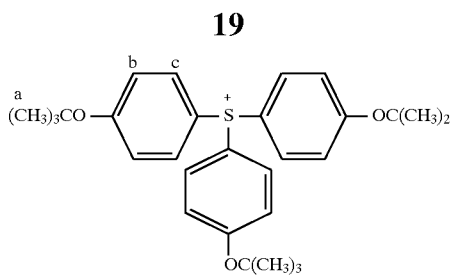

| (a) | 1.39 | singlet | 27H |
|---|---|---|---|
| (b) | 7.11–7.15 | doublet | 6H |
| (c) | 7.63–7.67 | doublet | 6H |
| (d) | 0.64 | singlet | 3H |
| (e) | 0.99 | singlet | 3H |
| (f) | 1.3–2.3 | multiplet | 7H |
| (g) | 2.79–2.85 | doublet | 1H |
| (h) | 3.37–3.42 | doublet | 1H |

IR:(cm$^{-1}$) 2977, 1741, 1583, 1488, 1394, 1369, 1305, 1261, 1159, 1074, 1043, 927, 896, 842, 622

Elemental analysis for $C_{40}H_{54}O_7S_2$ Calcd. (%) C: 67.6 H: 7.7 Found (%) C: 67.4 H: 7.9

Synthesis Example 4

Reaction was carried out as in Synthesis Example 2 except that (+)-10-camphorsulfonic acid was used instead of the butanesulfonic acid, obtaining (4-tert-butoxyphenyl) diphenylsulfonium (+)-10-camphorsulfonate with 97% purity in a yield of 32%.

The thus obtained (4-tert-butoxyphenyl) diphenylsulfonium (+)-10-camphorsulfonate was analyzed by NMR, IR, UV spectroscopy, and elemental analysis. The results are shown below.

$^1$H-NMR (CDCl$_3$, δ, ppm):

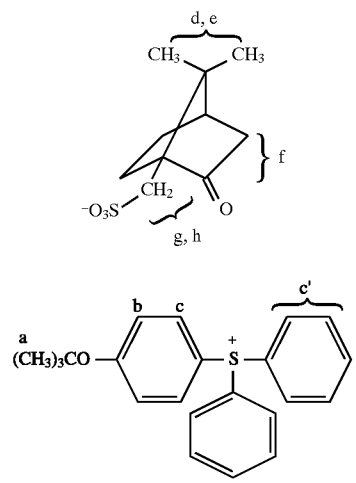

| (a) | 1.28 | singlet | 9H |
|---|---|---|---|
| (b) | 7.04–7.08 | doublet | 2H |
| (c + c') | 7.48–7.67 | multiplet | 12H |
| (d) | 0.64 | singlet | 3H |
| (e) | 0.99 | singlet | 3H |
| (f) | 1.1–2.3 | multiplet | 7H |
| (g) | 2.61–2.66 | doublet | 1H |
| (h) | 3.20–3.25 | doublet | 1H |

IR:(cm$^{-1}$) 2974, 1741, 1583, 1487, 1477, 1446, 1415, 1394, 1371, 1305, 1265, 1189, 1163, 1047, 997, 900, 752, 684, 620

Elemental analysis for $C_{32}H_{38}O_5S_2$ Calcd. (%) C: 67.8 H: 6.8 Found (%) C: 67.5 H: 6.9

Synthesis Example 5

Reaction was carried out as in Synthesis Example 1 except that phenyl Grignard reagent was used instead of the 4-tert-butoxyphenyl Grignard reagent, obtaining bis(4-tert-butoxyphenyl)phenylsulfonium butanesulfonate with 98% purity in a yield of 30%.

Synthesis Example 6

Reaction was carried out as in Synthesis Example 1 except that bis(4-dimethylaminophenyl) sulfoxide was used instead of the sulfoxide, obtaining (4-tert-butoxyphenyl)bis (4-dimethylaminophenyl)sulfonium butanesulfonate with 98% purity in a yield of 28%.

Synthesis Example 7

Reaction was carried out as in Synthesis Example 1 except that 4-dimethylaminophenyl Grignard reagent was used instead of the Grignard reagent, obtaining bis(4-tert-butoxyphenyl)(4-dimethylaminophenyl)sulfonium butanesulfonate with 98% purity in a yield of 34%.

Synthesis Examples 8–10

Reaction was carried out as in Synthesis Examples 5 to 7 except that (+)-10-camphorsulfonic acid was used instead of the butanesulfonic acid, obtaining sulfonium salts having (+)-10-camphorsulfonate as a counter anion as shown below.

Synthesis Example 8:

bis(4-tert-butoxyphenyl)phenylsulfonium (+)-10-camphorsulfonate, purity 96%, yield 32%

Synthesis Example 9:

(4-tert-butoxyphenyl)bis(4-dimethylaminophenyl) sulfonium (+)-10-camphorsulfonate, purity 98%, yield 27%

Synthesis Example 10:

bis(4-tert-butoxyphenyl)(4-dimethylaminophenyl) sulfonium (+)-10-camphorsulfonate, purity 97%, yield 32%

Synthesis Examples 11–15

Reaction was carried out as in Synthesis Examples 1, 2, 5 to 7 except that methanesulfonic acid was used instead of the butanesulfonic acid, obtaining sulfonium salts having methanesulfonate as a counter anion as shown below.

Synthesis Example 11:

tris(4-tert-butoxyphenyl)sulfonium methanesulfonate, purity 99%, yield 31%

Synthesis Example 12:

bis(4-tert-butoxyphenyl)phenylsulfonium methanesulfonate, purity 99%, yield 30%

Synthesis Example 13:

(4-tert-butoxyphenyl)diphenylsulfonium methanesulfonate, purity 99%, yield 28%

Synthesis Example 14:

(4-tert-butoxyphenyl)bis(4-dimethylaminophenyl) sulfonium methanesulfonate, purity 97%, yield 35%

Synthesis Example 15:

bis(4-tert-butoxyphenyl)(4-dimethylaminophenyl) sulfonium methanesulfonate, purity 98%, yield 32%

Synthesis Example 16

Reaction was carried out as in Synthesis Example 1 except that 3-tert-butoxyphenyl Grignard reagent was used instead of the 4-tert-butoxyphenyl Grignard reagent and bis(3-tert-butoxyphenyl) sulfoxide was used instead of the bis(4-tert-butoxyphenyl) sulfoxide, obtaining tris(3-tert-butoxyphenyl)sulfonium butanesulfonate with 98% purity in a yield of 25%.

Synthesis Example 17

Reaction was carried out as in Synthesis Example 1 except that 4-dimethylaminophenyl Grignard reagent was used instead of the 4-tert-butoxyphenyl Grignard reagent and bis(3-tert-butoxyphenyl) sulfoxide was used instead of the bis(4-tert-butoxyphenyl) sulfoxide, obtaining bis(3-tert-butoxyphenyl)(4-dimethylaminophenyl)sulfonium butanesulfonate with 97% purity in a yield of 21%.

Synthesis Example 18

Reaction was carried out as in Synthesis Example 3 except that phenyl Grignard reagent was used instead of the 4-tert-butoxyphenyl Grignard reagent and bis(3-tert-butoxyphenyl) sulfoxide was used instead of the bis(4-tert-butoxyphenyl) sulfoxide, obtaining bis(3-tert-butoxyphenyl)phenylsulfonium (+)-10-camphorsulfonate with 97% purity in a yield of 19%.

Synthesis Examples 19–23

The novel sulfonium salts having a tert-butoxy group obtained in Synthesis Examples 1 to 18 were treated in methanol or ethanol with the same sulfonic acid as the counter anion (e.g., methanesulfonate and butanesulfonate) for decomposing the protective group, to thereby form corresponding 4-hydroxyphenylsulfonium salts in a substantially quantitative manner. Thereafter, by a conventional process using di-tert-butyl dicarbonate, tert-butyl chloroacetate, dihydropyrane, dihydrofuran or ethyl vinyl ether, there were synthesized sulfonium salts having an alkylsulfonate anion and an acid labile group as shown below.

Synthesis Example 19:
bis(3-tert-butoxycarbonylmethyloxyphenyl)phenylsulfonium (+)-10-camphorsulfonate, purity 96%, yield 19%

Synthesis Example 20:
(4-tert-butoxycarbonyloxyphenyl)diphenylsulfonium butanesulfonate, purity 98%, yield 20%

Synthesis Example 21:
bis(4-(ethoxyethyl)oxyphenyl)(dimethylaminophenyl)sulfonium (+)-10-camphorsulfonate, purity 98%, yield 23%

Synthesis Example 22:
tris(4-(tetrahydrofuranyl)oxyphenyl)sulfonium butanesulfonate, purity 97%, yield 20%

Synthesis Example 23:
tris(3-(tetrahydropyranyl)oxyphenyl)sulfonium butanesulfonate, purity 96%, yield 21% cl Examples 1–15 & Comparative Examples 1–4

Resist compositions were prepared by dissolving a polyhydroxystyrene, a photoacid generator, and a dissolution rate inhibitor in a solvent in accordance with the formulation shown in Table 1.

The polyhydroxystyrene was selected from a polyhydroxystyrene derivative of the following formula Polym. 1 wherein the hydrogen atom of some hydroxyl groups is protected with a tert-butoxycarbonyl group, a polyhydroxystyrene derivative of the following formula Polym. 2 wherein the hydrogen atom of some hydroxyl groups is protected with a tetrahydrofuranyl group, and a polyhydroxystyrene derivative of the following formula Polym. 3 wherein the hydrogen atom of some hydroxyl groups is protected with a 1-ethoxyethyl group. The photoacid generator (PAG) was selected from the onium salts of the formulae PAG. 1 to PAG. 5. The dissolution rate inhibitor was 2,2'-bis(4-tert-butoxycarbonyloxyphenyl)propane of the formula DRI. 1. The solvent was 1-ethoxy-2-propanol (abbreviated as EtOIPA) or a solvent mixture of ethyl lactate (85 wt %) and butyl acetate (15 wt %).

Each of the compositions was passed through a 0.2-$\mu$m Teflon® filter. It was then spin coated onto a silicon wafer to form a coating of 0.7 $\mu$m thick. With the silicon wafer rested on a hot plate at 100° C., the coating was pre-baked for 120 seconds.

The film was exposed to a pattern of light by means of an excimer laser stepper model NSR 2005EX (manufactured by Nikon K. K., numerical aperture NA=0.5), baked at 90° C. for 90 seconds, and developed with an aqueous solution of 2.38% tetramethylammonium hydroxide, obtaining a positive pattern.

The resulting resist patterns were evaluated as follows.

First, sensitivity (Eth value) was determined. Provided that the exposure dose with which the top and bottom of a 0.30-$\mu$m line-and-space pattern were resolved at 1:1 was the optimum dose (sensitivity Eop), the minimum line width of a line-and-space pattern which was recognized separate at this dose was the resolution of a test resist. The profile of the resist pattern resolved was observed under a scanning electron microscope.

The resist was further determined for PED stability by exposing at the optimum exposure dose, leaving the resist film to stand for a varying time, and baking (PEB) the film. The delay time was determined at which a change in the resist pattern configuration was observed, for example, the line pattern became a T-top profile or resolution became impossible. The longer the delay time, the better is the PED stability. It is noted that in Examples 14 and 15, a nitrogenous compound or carboxylic acid derivative was added as an additive for imparting PED stability.

The results are shown in Table 1.

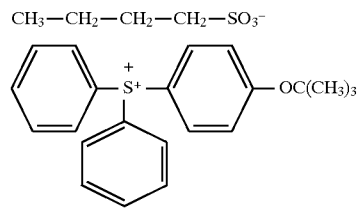

PAG.1

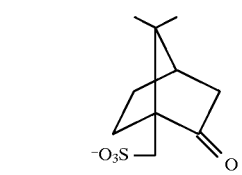

PAG.2

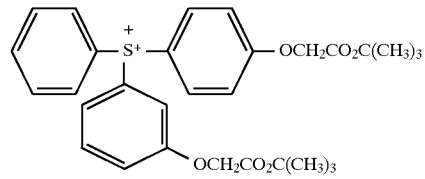

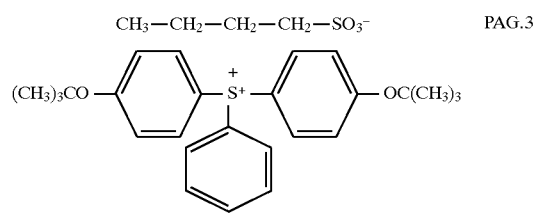

PAG.3

-continued

PAG.4

[structure: triphenylsulfonium with OCO₂C(CH₃)₃ substituent, CF₃SO₃⁻ counterion]

PAG.5

[structure: bis(4-tert-butylphenyl)iodonium, CF₃SO₃⁻ counterion]

DRI.1

(CH₃)₃COCO₂—C₆H₄—C(CH₃)₂—C₆H₄—OCO₂C(CH₃)₃

Polym.1

[structure: copolymer of p-(tert-butoxycarbonyloxy)styrene (a) and p-hydroxystyrene (b)]

Polym.2

[structure: copolymer of p-(tetrahydrofuranyloxy)styrene (a) and p-hydroxystyrene (b)]

Polym.3

[structure: copolymer of p-(1-ethoxyethoxy)styrene (a) and p-hydroxystyrene (b)]

a/(a+b) = 0.1–0.4
Mw 3,000–100,000

TABLE 1

| | Resist composition (pbw) | | | | Sensitivity | | | PED |
|---|---|---|---|---|---|---|---|---|
| | Alkali soluble resin | Photoacid generator | Dissolution rate inhibitor | Additive | Solvent | Eop (mJ/cm$^2$) | Resolution (μm) | Pattern profile | stability (min.) |
| E1 | Polym. 1 (80) | PAG. 1 (5) | DRI. 1 (20) | — | EtOIPA (500) | 72.0 | 0.28 | rectangular | 30 |
| E2 | Polym. 1 (40) Polym. 2 (40) | PAG. 1 (5) | DRI. 1 (20) | — | EtOIPA (500) | 54.0 | 0.26 | rectangular | 60 |
| E3 | Polym. 1 (40) Polym. 3 (40) | PAG. 1 (5) | DRI. 1 (20) | — | EtOIPA (500) | 40.0 | 0.24 | rectangular | 60 |
| E4 | Polym. 1 (40) Polym. 3 (40) | PAG. 1 (2) PAG. 4 (2) | DRI. 1 (20) | — | EtOIPA (500) | 17.0 | 0.24 | rectangular | 60 |
| E5 | Polym. 2 (75) | PAG. 3 (5) | — | — | EtOIPA (450) | 38.0 | 0.30 | rectangular | 120 |
| E6 | Polym. 3 (75) | PAG. 2 (5) | — | — | EtOIPA (450) | 33.0 | 0.30 | rectangular | 120 |
| E7 | Polym. 2 (70) | PAG. 3 (5) | DRI. 1 (20) | — | EtOIPA (500) | 41.0 | 0.24 | rectangular | 120 |
| E8 | Polym. 3 (70) | PAG. 2 (5) | DRI. 1 (20) | — | EtOIPA (500) | 37.0 | 0.24 | rectangular | 120 |
| E9 | Polym. 2 (70) | PAG. 1 (3) PAG. 5 (2) | DRI. 1 (10) | — | EtOIPA (500) | 21.0 | 0.24 | rectangular | 60 |
| E10 | Polym. 1 (40) Polym. 2 (40) | PAG. 2 (2) PAG. 4 (2) | DRI. 1 (20) | — | PGMEA (450) | 19.0 | 0.24 | rectangular | 60 |
| E11 | Polym. 1 (40) Polym. 3 (40) | PAG. 3 (2) PAG. 4 (2) | DRI. 1 (20) | — | EL/BA (500) | 15.0 | 0.24 | rectangular | 60 |

TABLE 1-continued

| | Resist composition (pbw) | | | | | Sensitivity | | | PED |
|---|---|---|---|---|---|---|---|---|---|
| | Alkali soluble resin | Photoacid generator | Dissolution rate inhibitor | Additive | Solvent | Eop (mJ/cm$^2$) | Resolution ($\mu$m) | Pattern profile | stability (min.) |
| E12 | Polym. 1 (40) Polym. 2 (40) | PAG. 1 (3) PAG. 4 (2) | DRI. 1 (20) | — | EtOIPA (500) | 19.0 | 0.24 | rectangular | 60 |
| E13 | Polym. 1 (40) Polym. 3 (40) | PAG. 3 (2) PAG. 4 (2) | DRI. 1 (20) | — | EtOIPA (500) | 18.0 | 0.24 | rectangular | 60 |
| E14 | Polym. 1 (40) Polym. 3 (40) | PAG. 1 (5) | DRI. 1 (20) | NMP (0.1) | EtOIPA (450) | 51.0 | 0.26 | rectangular | 120 |
| E15 | Polym. 1 (40) Polym. 2 (40) | PAG. 1 (5) | DRI. 1 (20) | BHVA (10) | EtOIPA (450) | 63.0 | 0.26 | rectangular | 90 |
| CE1 | Polym. 1 (75) | PAG. 4 (5) | DRI. 1 (20) | — | EtOIPA (500) | 4.0 | 0.28 | somewhat forward taper | ≦5 |
| CE2 | Polym. 2 (75) | PAG. 5 (5) | DRI. 1 (20) | — | EtOIPA (500) | 4.0 | 0.30 | somewhat forward taper | ≦5 |
| CE3 | Polym. 3 (75) | PAG. 5 (5) | DRI. 1 (20) | — | EtOIPA (500) | 4.0 | 0.30 | forward taper | ≦5 |
| CE4 | Polym. 1 (80) | PAG. 4 (6) | — | — | EtOIPA (500) | 5.0 | 0.30 | forward taper | ≦5 |

EtOIPA: 1-ethoxy-2-propanol
PGMEA: propylene glycol monomethyl ether acetate
EL/BA: a solvent mixture of ethyl lactate (85 wt %) and butyl acetate (15 wt %)
NMP: N-methylpyrrolidone
BHVA: 4,4-bis(4-hydroxyphenyl)valeric acid Japanese Patent Application No. 309847/1995 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A sulfonium salt having at least one acid labile group attached to a phenyl group in a molecule and a normal, branched or cyclic alkylsulfonate and represented by formula (1):

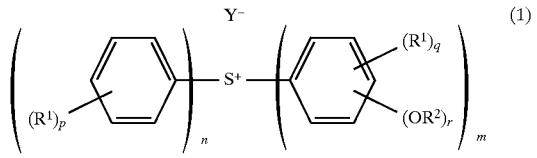

wherein R$^1$ is an alkyl, alkoxy or dialkylamino group, the groups represented by R$^1$ may be the same or different, OR$^2$ is an acid labile group, Y is a normal, branched or cyclic alkylsulfonate having 1 to 20 carbon atoms which may contain a carbonyl double bond (C=O), ether bond (C—O—C) or alcoholic hydroxyl group, letter n is an integer of 0 to 2, m is an integer of 1 to 3, the sum of n and m is equal to 3, r is an integer of 1 to 5, p is an integer of 0 to 5, q is an integer of 0 to 4, the sum of q and r is an integer of 1 to 5.

2. In a chemically amplified positive resist composition comprising a sulfonium salt and conventional components, the improvement wherein the sulfonium salt is one of formula (1) as set forth in claim 1.

3. A chemically amplified positive resist composition comprising (A) an organic solvent,
(B) an alkali soluble resin,
(C) a dissolution rate inhibitor having an acid labile group,
(D) a sulfonium salt of formula (1) as set forth in claim 1, and
(E) a photoacid generator other than (D).

4. The composition of claim 3 wherein said alkali soluble resin (B) is a polyhydroxystyrene in which hydrogen atoms of some hydroxyl groups are replaced by acid labile groups and which has a weight average molecular weight of about 3,000 to about 100,000.

5. A chemically amplified positive resist composition comprising (A) an organic solvent,
(B) an alkali soluble resin,
(D) a sulfonium salt of formula (1) as set forth in claim 1, and
(E) a photoacid generator other than (D).

6. The composition of claim 5 wherein said alkali soluble resin (B) is a polyhydroxystyrene in which hydrogen atoms of some hydroxyl groups are replaced by acid labile groups and which has a weight average molecular weight of about 3,000 to about 100,000.

7. A chemically amplified positive resist composition according to claim 5, wherein R$^1$ is C$_{1-8}$-alkyl or C$_{1-8}$-alkoxy.

8. A sulfonium salt according to claim 1, wherein R$^1$ is C$_{1-8}$-alkyl or C$_{1-8}$-alkoxy.

9. A sulfonium salt according to claim 1, wherein R$^1$ is C$_{1-8}$-alkyl, C$_{1-8}$-alkoxy or di-C$_{1-4}$-alkylamino.

10. A sulfonium salt according to claim 1, wherein OR$^2$ is a tertiary alkoxy group, a carbonate group, a tertiary carboxylate group, a trialkylsilyloxy group, an acetal group or a ketal group.

11. A chemically amplified positive resist composition comprising (A) an organic solvent,
(B) an alkali soluble resin,
(C) a dissolution rate inhibitor having an acid labile group, (D) a sulfonium salt of formula (1) as set forth in claim 1, and (F) an onium salt of formula 8

$(R^4)_aMy'$ wherein each $R^4$ is independently an optionally substituted aromatic group, M is sulfonium or iodonium, Y' is an optionally substituted alkylsulfonate or arylsulfonate, and a is 2 or 3.

12. A chemically amplified positive resist composition according to claim 11, wherein $R^4$ is phenyl optionally substituted by alkyl or alkoxy.

13. A chemically amplified positive resist composition comprising (A) an organic solvent, (B) an alkali soluble resin, (C) a dissolution rate inhibitor having an acid labile group, and (D) a sulfonium salt of formula (1) a set forth in claim 1.

14. A chemically amplified positive resist composition comprising (A) an organic solvent, (B) an alkali soluble resin, and (D) a sulfonium salt of formula (1) a set forth in claim 1.

15. A sulfonium salt having at least one acid labile group attached to a phenyl group in a molecule and a normal, branched or cyclic alkylsulfonate and represented by formula (1):

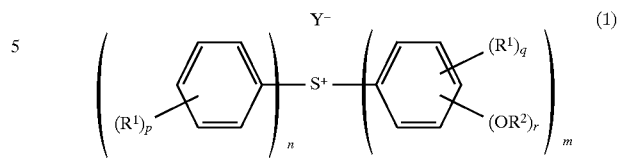

wherein $R^1$ is an alkyl, alkoxy or dialkylamino group, the groups represented by $R^1$ may be the same or different, $OR^2$ is an acid labile group, Y is methylsulfonate, ethylsulfonate, propylsulfonate, butylsulfonate, isopropylsulfonate, sec-butylsulfonate, isobutylsulfonate, tert-butylsulfonate, hexylsulfonate, ocytylsulfonate, 1-hydroxycyclohexylsulfonate, 1-methyoxycyclohexylsulfonate or (+)-10-camphorsulfonate, letter n is an integer of 0 to 2, m is an integer of 1 to 3, the sum of n and m is equal to 3, r is an integer of 1 to 5, p is an integer of 0 to 5, q is an integer of 0 to 4, the sum of q and r is an integer of 1 to 5.

16. In a chemically amplified positive resist composition comprising a sulfonium salt and conventional components, the improvement wherein the sulfonium salt is one of formula (1) as set forth in claim 15.

\* \* \* \* \*